United States Patent
Wang

(10) Patent No.: US 8,383,493 B2
(45) Date of Patent: Feb. 26, 2013

(54) PRODUCTION OF SEMICONDUCTOR DEVICES

(76) Inventor: Wang Nang Wang, Bath (GB)

(*) Notice: Subject to any disclaimer, the term of this patent is extended or adjusted under 35 U.S.C. 154(b) by 0 days.

(21) Appl. No.: 12/376,435

(22) PCT Filed: Jan. 31, 2008

(86) PCT No.: PCT/GB2008/050063
§ 371 (c)(1),
(2), (4) Date: May 11, 2010

(87) PCT Pub. No.: WO2009/096099
PCT Pub. Date: Aug. 6, 2009

(65) Prior Publication Data
US 2010/0276665 A1    Nov. 4, 2010

(30) Foreign Application Priority Data

Feb. 9, 2007 (GB) .................................. 0702560.4
Apr. 30, 2007 (GB) .................................. 0708281.1

(51) Int. Cl.
*H01L 21/84* (2006.01)
(52) U.S. Cl. ............... 438/479; 438/481; 257/E21.561
(58) Field of Classification Search .......... 438/479–485; 257/E21.561
See application file for complete search history.

(56) References Cited

U.S. PATENT DOCUMENTS

| 5,210,051 A * | 5/1993 | Carter, Jr. .................. 438/22 |
| 6,221,684 B1 * | 4/2001 | Sugawara et al. ............ 438/47 |
| 6,596,377 B1 | 7/2003 | Hersee et al. |
| 6,746,889 B1 * | 6/2004 | Eliashevich et al. ............ 438/33 |
| 6,900,070 B2 * | 5/2005 | Craven et al. .................... 438/41 |
| 2003/0006211 A1 | 1/2003 | Fukunaga et al. |
| 2004/0157358 A1 | 8/2004 | Hiramatsu et al. |
| 2006/0091408 A1 | 5/2006 | Kim et al. |
| 2006/0223211 A1 | 10/2006 | Mishra et al. |
| 2006/0270201 A1 | 11/2006 | Chua et al. |
| 2007/0029643 A1 | 2/2007 | Johnson et al. |
| 2008/0000871 A1 * | 1/2008 | Suh et al. .......................... 216/2 |
| 2008/0315226 A1 | 12/2008 | Kuo et al. |

FOREIGN PATENT DOCUMENTS

| JP | 2001-217506 | 8/2001 |
| JP | 2003-518737 | 6/2003 |
| JP | 2006-352148 | 12/2006 |
| WO | WO 2006/060599 | 6/2006 |

OTHER PUBLICATIONS

International Search Report dated May 8, 2008 for International application No. PCT/GB2008/050063.
International Search Report dated Sep. 10, 2007 for National application No. GB708281.1.

* cited by examiner

*Primary Examiner* — Richard A. Booth
(74) *Attorney, Agent, or Firm* — Christie, Parker & Hale, LLP

(57) ABSTRACT

A method of producing a layered semiconductor device comprises the steps of: (a) providing a base comprising a plurality of semiconductor nano-structures, (b) growing a semiconductor material onto the nano-structures using an epitaxial 5 growth process, and (c) growing a layer of the semiconductor material using an epitaxial growth process.

18 Claims, 4 Drawing Sheets

PRODUCTION OF SEMICONDUCTOR DEVICES

CROSS-REFERENCE TO RELATED APPLICATION

The present application is the National Stage of International Application No. PCT/GB2008/050063, filed Jan. 31, 2008, which claims the benefit under 35 U.S.C. §119 of United Kingdom Application No. 0702560.4, filed Feb. 9, 2007 and United Kingdom Application No. 0708281.1, filed Apr. 30, 2007, both of which are incorporated herein by reference in their entirety.

FIELD OF THE INVENTION

The present invention relates to a method of producing a layered semiconductor device and a semiconductor device thus produced.

BACKGROUND

Wide band-gap GaN and related materials are recognized to be among the most attractive compound semiconductors for use in a variety of devices. They are adapted for optoelectronic and microelectronic devices which operate in a wide spectral range, from visible to ultraviolet and in the high temperature/high power applications area. The main advantages of nitride semiconductors in comparison with other wide-band-gap semiconductors are their low propensity to degrade at high temperature and high power when used for optical and microelectronic devices. Meanwhile, low-dimensional quantum confinement effects (i.e. in quantum wires and dots) are expected to become one of the foremost technologies for improving optical device performances. Fabrication of a variety of low-dimensional structures in III-V nitrides has been undertaken using methods such as etching, re-growth, overgrowth on selected areas, growth on tilted substrates, self-organization process, etc.

Despite the technological advances of the last few years, one of the key obstacles preventing further developments in GaN devices is the lack of high quality and commercially available low-cost, free-standing GaN templates. Alternative substrates, such as sapphire and SiC, are commonly employed in nitride-based devices. As a result of lattice mismatch and large differences in the thermal expansion coefficients between the deposited film and substrate (heteroepitaxy), a very high ($10^9$ to $10^{10}$ cm$^{-2}$) density of threading dislocations and serious wafer bending/cracking, induced by undesired residual strain, occurs in the grown nitride layers. These factors can significantly affect the performance and lifetime of nitride-based optoelectronic and microelectronic devices.

Epitaxial lateral overgrowth technique (so-called ELOG and its modifications: facet initiated epitaxial lateral overgrowth (FIELO) and Pendeo (from the Latin to hang or be suspended)) is the most widely used approach employed for suppressing bending and a significant fraction of the threading dislocations in the material. Laterally overgrowing oxide (or metal) stripes deposited on initially-grown GaN films has been shown to achieve about two orders of magnitude reduction in the dislocation density, reducing it to the $10^7$ cm$^{-2}$ level. However, the low defect-density material only occurs in the wing region, located in the coalescence front, and represents only approximately one fifth of the whole wafer surface area. Large coalescence front tilting and tensile stress are both present in the overgrowth region. Asymmetric stress due to the rectangular masks also results in asymmetric bowing of the wafers.

Low defect-density free-standing GaN is currently one of the materials of choice to achieve the desired specification for optoelectronic and microelectronic devices. The record nitride laser lifetime of 15,000 hours under CW-operation at the 30 mW output level has recently been demonstrated by Nichia Chemicals Inc., using the HVPE-grown substrate. However, the free-standing GaN substrates are very expensive, and the defects density is not as low as the Si, GaAs and InP wafers.

Various vapor deposition methods suitable for growing GaN materials are described in U.S. Pat. Nos. 6,413,627, 5,980,632, 6,673,149, 6,616,757, 4,574,093, 6,657,232 and 2005/0199886. Other publications relating to such methods include:

1. Handbook of Crystal Growth, Vol 3, edited by D. T. J. Hurle, Elsevier Science 1994.
2. R. F. Davis et al, 'Review of Pendeo-Epitaxial Growth and Characterization of Thin Films of GaN and AlGaN Alloys on 6H—SiC(0001) and Si(111) Substrates.' MRS Internet J. Nitride Semicond. Res. 6, 14, 1 (2001).
3. M. Yoshiawa, A. Kikuchi, M. Mori, N. Fujita, and K. Kishino, 'Growth of self-organised GaN nanostructures on Al2O3 (0001) by RF-radical source molecular beam epitaxy.' Jpn. J. Appl. Phys., 36, L359 (1997).
4. K. Kusakabe, A. Kikuchi, and K. Kishino, 'Overgrowth of GaN layer on GaN nano-columns by RF-molecular beam epitaxy.' J. Crystl. Growth., 237-239, 988 (2002).
5. J. Su et al, 'Catalytic growth of group III-nitride nanowires and nanostructures by metalorganic chemical vapor deposition.' Appl. Phys. Lett., 86, 13105 (2005).
6. G. Kipshidze et al, 'Controlled growth of GaN nanowires by pulsed metalorganic chemical vapor deposition.' Appl. Phys. Lett., 86, 33104 (2005).
7. H. M. Kim et al, 'Growth and characterization of single-crystal GaN nanorods by hydride vapor phase epitaxy.' Appl. Phys. Lett., 81, 2193 (2002).
8. C. C. Mitchell et al., 'Mass transport in the epitaxial lateral overgrowth of gallium nitride.' J. Cryst. Growth., 222, 144 (2001).
9. K. Hiramatsu., 'Epitaxial lateral overgrowth techniques used in group III nitride epitaxy.' J. Phys: Condens, Matter., 13, 6961 (2001).
10. R. P. Strittmatter, 'Development of micro-electromechnical systems in GaN', PhD Thesis, California Institute of Technology, P. 92 (2003).

SUMMARY OF THE INVENTION

The present proposes to grow thick compound semiconductors on top of "nano-structures", i.e. discrete formations of dimensions in the order of nanometers, as in British Patent Application No. 0605838.2. The mass-production of such semiconductor material has been proposed in British Patent Application No. 0701069.7. The present invention extends the methodology proposed in those applications, to enable full semiconductor devices to be grown.

In this context, a "thick" semiconductor is one that is substantially self-supporting, typically of thickness greater than about 50 µm.

The present provides a method of growing high-quality devices, which exhibit both low stress and low defect-density. This is achieved by using fabricated nano-structure compliant layers to decouple the lattice mismatch and the difference of thermal expansion coefficient between the substrate and the top devices.

In accordance with a first aspect of the present invention there is provided a method of producing a layered semiconductor device as set out in the accompanying claims.

According to a second aspect of the present invention, there is provided a semiconductor device as set out in the accompanying claims.

A substrate is provided which the plurality of nano-structures may be located on, the substrate material preferably being selected from the group consisting of sapphire, silicon, silicon carbide, diamond, metals, metal oxides, compound semiconductors, glass, quartz and composite materials. For the growth of normal polar materials such as c-plane GaN, the crystal orientation of the substrate can be c-plane sapphire. For the growth of non-polar materials such as a-plane or m-plane GaN, the crystal orientation of the substrate can be γ-plane sapphire or m-plane 4H- or 6H—SiC respectively.

The substrate material may also be selected from the group consisting of conductive substrates, insulating substrates and semi-conducting substrates.

The nano-structures may be fabricated by etching a template with a semiconductor layer which may be grown by molecular beam epitaxy (MBE), metalorganic chemical vapor deposition (MOCVD) (such as metalorganic vapor phase epitaxy (MOVPE)), sputtering, hydride vapor phase epitaxy (HVPE), or any other semiconductor growth methods onto a substrate. The template can be made of a simple layer, or multiple layers, or of the heterostructure, or of superlattices consisting of n- and p-type doped and un-doped semiconductors such as AlN, $Al_xGa_{1-x}N$ with $1>x>0$, GaN, $In_xGa_{1-x}N$ with $1>x>0$. The total thickness of the grown semiconductor layers is preferably less than 3 μm. Examples of such templates can be: substrate/amorphous AlN (~200 to 500 nm)/ GaN (50-100 nm), substrate/AlN (~20 nm)/GaN (1-3 μm); substrate/AlN (~20 nm)/AlGaN (1-3 μm)/GaN (10-100 nm); substrate/AlN (~20 nm)/AlGaN (1-3 μm)/InGaN (10-100 nm)/GaN (10-100 nm); substrate/GaN/(AlGaN 2.5-10 nm/GaN 2.5-10 nm superlattices); substrate/GaN/(AlGaN 2.5-10 nm/AlN 2.5-10 nm superlattices)/GaN (10-100 nm); substrate/GaN/(InGaN 2.5-10 nm/GaN 2.5-10 nm superlattices)/GaN (10-100 nm); substrate/$Si_3N_4$/AlN (~20 nm)/GaN (1-3 μm)/p-GaN (10-100 nm).

Such an etching process involves forming a mask (also termed a "nano-mask" due to the dimensions involved) onto the template to control the dimensions of the nano-structures produced. The mask can be produced by a metal annealing (for example Ni) method, the anodic porous alumina method, interferometry, holography, e-beam lithography, photolithography, nano-imprint, or any other suitable method.

The pattern of nano-structures formed may either be random or pre-determined depending on the process employed, to achieve desired physical or chemical properties. For example, the annealing method would produce a random pattern of nano-structures. The anodic alumina method may produce both random and determined hexagonal patterns depending on the stress of the processes used, e.g. whether or not a pre-indentation mark is used. Photolithography, interferometry and nano-imprinting can all produce custom patterns. Nano-imprinting can also produce a random pattern if the masks used are based on annealed metals such as Ni.

Metal annealing nano-mask fabrication processes involve:
(a) depositing dielectric materials onto the semiconductor layer template;
(b) depositing thin metal materials onto the dielectric layer;
(c) annealing the metal under controlled gas ambient temperature to form high density nano-masks;
(d) dry and wet etching the dielectric materials using metal nano-masks;
(e) dry and wet etching the semiconductor materials using the metal and dielectric nano-masks to form a high density of nanostructures.

Anodic porous alumina nano-mask fabrication processes involve:
(a) depositing dielectric materials onto the semiconductor layer template;
(b) depositing thin Al onto the dielectric layer;
(c) anodizing the Al under controlled electrolyte, temperature and voltage to form high density anodic porous alumina nano-masks;
(d) depositing metal materials on to the alumina nano-masks;
(e) wet etching to remove the alumina nano-masks;
(f) dry and wet etching the semiconductor materials using the metal and dielectric nano-masks to form a high density of nanostructures.

Nano-imprint nano-mask fabrication processes involve:
(a) depositing dielectric materials onto the semiconductor layer template;
(b) nano-imprinting and developing the nano-holes masks onto the dielectric materials;
(c) depositing thin metal materials onto the nano-holes masks;
(d) removing the nano-imprinted masks to form the periodically aligned metal quantum dots nano-masks;
(e) dry and wet etching the dielectric materials using metal nano-masks;
(f) dry and wet etching the semiconductor materials using the metal and dielectric nano-masks to form a high density of nanostructures.

In some cases, the template may consist of a substrate only, i.e. without any semiconductor layer grown on top of the substrate. In such cases, the mask is fabricated directly onto the substrate.

In nano-imprint nano-mask fabrication technology, the "master" mask can be produced by methods such as interferometry, E-beam lithography, sub-micrometer photolithography, or x-ray lithography. The mask pattern can be custom-designed to consist of a photonic crystal structure, high symmetry photonic quasicrystal, gratings, and any other patterns for desired optical effects.

A dielectric material such as $SiO_2$ or $Si_3N_4$, which can be deposited by sputtering, e-beam evaporation or plasma-enhanced chemical vapor deposition (PECVD), may serve as the mask with the replicated pattern from the nano-masks produced by the above-mentioned technologies. The thickness of the dielectric layer depends on the etching selectivity between the dielectric materials and the semiconductor layers to be etched.

The nano-structures thus fabricated have an aspect ratio (i.e. height versus width) much larger than one. Dry etching of the semiconductor layers may be carried out by reactive ion etching (RIE) or inductively coupled plasma etching (ICP) using Ar, $Cl_2$, $BCl_3$ or $H_2$ gas mixtures. The etching process etches the semiconductor layers off until the substrate is fully exposed. The layer structure is preferably grown in such a way that the lateral growth rate in the bottom and middle parts of the fabricated nano-structures is much smaller than that of the top part. One example of the layer structure of the nano-structures consists of layers such as substrate/AlN (~20 nm)/ n-$Al_{0.03}Ga N_{0.97}$ (2 μm)/p-GaN (80 nm). The lateral growth rate of the GaN along the surface of AlN and n-$Al_{0.03}GaN_{0.97}$ is much slower than that of p-GaN due to the slower diffusivity of Al in AlGaN and the possible presence of trace aluminum oxide.

The dimension of the nano-structures can be modified by further wet etching using different acids and bases. Such treatment allows the fine tuning of the diameter of the nano-structures for optimized lateral overgrowth and ready separation of such grown thick free-standing compound semiconductor materials from the substrate.

In-situ or ex-situ nitridation of the nano-structures can be performed to reduce the coalescence of the nano-structures in the root during the lateral overgrowth, hence maximizing the decoupling mechanism of the nano-structures to reduce the defect density and cracks of the top lateral-grown thick layers.

One example of the layer structure of the nano-structures consists of layers such as (111) Si/amorphous AlN (~200 nm)/n-$Al_{0.06}GaN_{0.94}$ (~100 nm)/p-GaN (80 nm). The nano-structures may then be fabricated by etching down to expose about 500 nm Si. The nitridation process using $NH_3$ to convert Si into $Si_3N_4$ helps to prevent the lateral overgrowth of GaN at the bottom of the nano-structures. The integrity of the voids between the nano-structures facilitates the formation of low stress and low defect density top layers during the subsequent lateral epitaxial growth.

Fabricated III-Nitrides nano-structure templates can be loaded for the initial thin continuous GaN epitaxial lateral overgrowth (ELOG) using MBE, MOCVD or HVPE. Thus prepared templates can then be loaded for the full device epitaxial growth using MOCVD, MBE and HVPE.

The single-crystal semiconductor material may comprise a different material from the nano-structures.

The semiconductor material may be undoped, or n- or p-type doped.

The compound semiconductor devices produced by the method are epitaxially grown. This growth may be carried out by various methods, for HVPE, MOCVD (MOVPE), CVD, sputtering, sublimation, or an MBE method, or by selectively combining HVPE, MOCVD (MOVPE), CVD, sputtering, sublimation, and MBE methods.

The epitaxially-grown devices may consist of undoped, n- or p-type doped materials.

The epitaxial growth may be partially conducted using a pulsed growth method.

In one embodiment, the growth of the devices is performed while rotating the substrate.

The grown compound semiconductor devices may be separated from the substrate after the p-side of the device has been bonded to a sub-mount wafer. The separation can be done for example by mechanically cracking the relatively weak nano-structures, or by wet etching, photochemical etching, electrochemical etching, or by laser ablation.

An exemplary method in accordance with the invention utilizes HVPE to grow high quality flat, low strain and low defect density compound semiconductors onto foreign substrates using nano-structure compliant layers and epitaxial lateral overgrowth. Examples of suitable nano-structures include nano-columns (also known as "nano-rods" or "nano-wires") of substantially constant diameter along the majority of their length, or other structures, for example pyramids, cones or spheroids which have varying diameter along their major dimensions. For simplicity, the following description will discuss the use of nano-columns, however it should be realized that other suitable nano-structures such as those mentioned above may be also be used, and indeed may be advantageous for certain applications. Nano-columns of semiconductor materials can be fabricated on any foreign substrates with the initial compound semiconductor layers grown by MBE, CVD, MOCVD (MOVPE) or HVPE methods. Such nano-columns may typically have a diameter of about 10 to 120 nm. Further growth of full device epitaxial compound semiconductor layers can be achieved by MBE, MOCVD or HVPE.

Compound semiconductor layer bending due to the thermal expansion coefficient difference between the compound semiconductor materials and the substrate can be minimized by a balanced dimension of the nano-column and air gap, which functions to decouple the impact of the substrate. Low strain, low defect density and flat compound semiconductor films can therefore be grown using this technique. Nanopendeo lateral overgrowth using these nano-columns will minimize the defects on the top compound semiconductor film through the defects bending mechanism in the interface of nano-column and lateral grown layer. The small dimension of the nano-columns will also minimize the facet tilt in the grain boundary of lateral overgrown layer. The controlled dimension of the nano-columns and the localized stress between the nano-column and lateral-grown layer also allows the compound semiconductor layer, for example GaN, to be readily separated from the substrate during rapid cooling or mechanical twisting. An anodic electrochemical selective etch process for p-GaN can also be used to separate the GaN film from the substrate in the case where the etched nano-columns consist of a thin p-GaN top layer. The GaN may then undergo the further epitaxial growth for a complete device.

The initial substrates can be of different crystal orientation, for example: c-plane sapphire, γ-plane sapphire, m-plane 4H and 6-H SiC. By using nano-columns fabricated on the initial non-polar or polar compound semiconductor layers grown on top of the substrates of different crystal orientation, high quality, low strain and low defect density non-polar and polar compound semiconductor layers can be overgrown. Hence the present invention can provide a very economical mass production technology for high performance devices grown on top of the low strain and low defect density compound semiconductor materials.

The same growth method described above can also apply to the growth of low strain and low defect density AlN and AlGaN using $AlCl_3$ precursors formed by passing HCl through Al. AlN is very difficult to coalesce under the normal ELOG growth technique, but using a nano-column compliant layer with a nano-size air gap facilitates a very fast coalescence for AlN and AlGaN.

The growth processes provided by the present invention can be applied to the family of III-V nitride compounds, generally of the formula $In_xGa_yAl_{1-x-y}N$, where $0 \leq x \leq 1$, $0 \leq y \leq 1$, and $0 \leq x+y \leq 1$, or other suitable semiconducting nitrides. Group II-VI compounds may also be suitable for production through the methodology of the present invention. The semiconductor may for example comprise materials such as GaN, AlN, InN, ZnO or SiC. Throughout the following description, the present invention is described using GaN as an example of an epitaxial III-V nitride layer as the semiconductor material for convenience, though any suitable semiconducting material may be used.

The hydride-vapor phase epitaxy (HVPE), also called chloride transport chemical vapor deposition, of GaN is a relatively well-established process based on the gaseous transport of the group III and group V elements to the deposition zone of a growth reactor. In this technique, Cl is used to transport the group-III species instead of organometallic sources in the MOCVD technique. This has a distinct advantage in that large growth rates (up to 200 μm/hr) can be achieved by this technique over the MOCVD or the MBE methods (≦2 μm/hr). In contrast to MOCVD, which is a non-equilibrium cold-wall reactor-based technique, HVPE is a reversible equilibrium-based process in which a hot-wall reactor is employed. The typical growth procedure is as follows. Sapphire, silicon carbide, zinc oxides or other compatible substrates are inserted into the deposition zone of the growth chamber and heated. When the final growth temperature is reached the $NH_3$ flow is started. After a period to allow the $NH_3$ concentration to reach a steady-state value, HCl flow is started to provide transport of the gallium chloride (GaCl), which is synthesized by reacting HCl gas with liquid Ga metal in the Ga zone at 800-900° C. via the reaction: $2HCl(g)+2Ga(l)\rightarrow 2GaCl(g)+H_2(g)$. An alternative method of synthesis is by reacting Chlorine gas with Ga metal around 125° C. Then gaseous GaCl is transported from the Ga zone to the deposition zone to react with $NH_3$ at 900-1200° C. to form GaN via the reaction $GaCl(g)+NH_3(g)\rightarrow GaN(s)+HCl(g)+H_2(g)$. Another major advantage of the HVPE growth method is the mutual annihilation of mixed dislocations lowering the defect densities in thicker GaN.

The use of fabricated GaN nano-columns, for example, as the compliant layer to grow GaN has several advantages. The mechanical confinement occurs between the interface of the nano-columns and top lateral grown layer due to the small diameter and the high aspect ratio of the column (height versus diameter). The stress and dislocations are mostly localized in the interface between the GaN nano-columns and the top lateral grown layer. Thus growth leads to the top lateral overgrowth layer being nearly free of stress and dislocations. In addition, the defects caused by the mosaic structure in conventional GaN films, arising from a spread of initial island misorientations can be minimized, since badly misoriented nano-columns eventually grow out, improving the general alignment. The topography of nano-columns with a narrow air gap permits coalescence with a very thin overgrown layer. Typically only ~0.1-0.2 μm thickness is required for continuous overgrown GaN layers. This narrow air gap will also facilitate the very fast coalescence to form continuous AlN by the epitaxial lateral overgrowth of AlN onto these nano-columns. With all the advantages described above, high-quality GaN can therefore be grown on this fabricated nano-column compliant layer, and has very little tilting in the coalesced front either on top of the nano-columns or on top of the air gap in comparison with other ELOG or Pendeo processes.

A device grown on top of the fabricated nano-column compliant layers can be fabricated and packaged with the substrate attached. Alternatively, such a device may be fabricated and packaged with the substrate removed. The separation of the grown device can be achieved for example by various methods. In brittle materials such as sapphire and III-V nitrides, cracking may occur easily if the stress exceeds a critical value. Fabricated III-nitrides nano-columns with high aspect ratio and nano-dimensions facilitates the cracking mechanism between the substrate and the top device due to the large difference of the thermal expansion coefficient, particularly when the rapid cooling is carried out after the growth. A further mechanical twisting will push the local stress to exceed the critical value to separate the top layers. Another method of separating the GaN from the substrate is to use anodic electrochemical etching. In this case, a thin p-GaN layer is deposited at the top of the semiconductor layers. The nano-columns with the p-GaN tip are fabricated by etching processes. Using a suitable electrolyte and bias voltage results in p-GaN being selectively etched off, to leave the thick top GaN (undoped or n-doped) untouched. Other methods such as chemical etching using KOH, oxalic acid or phosphoric acid etc, or photochemical etching combining wet chemical etching and UV light, or rapidly cooling the substrate are all suitable for separating the device from the substrate. Laser ablation can also be used to separate the devices via from the substrate. The separation can also be conducted with a combination of the above-mentioned methods.

If γ-plane sapphire is used as the substrate, non-polar a-plane GaN can be grown using the nano-column compliant layers, these being fabricated by etching the initial-grown low-quality a-plane GaN, and custom designed non-polar layers. The a-plane GaN thus grown will have very low strain and low defect density, which is particularly suitable for the further growth of non-polar plane-based high quality devices such as light emitting diodes, laser diodes, and microelectronic devices. The m-plane GaN can be grown on (100) LiAlO2, m-plane 4H- or 6H—SiC using similarly-fabricated nano-column compliant layers. The use of non-polar materials also allows band gap engineering to grow monolithic broadband light emitting diodes such as white LEDs with the combination of different width quantum wells.

BRIEF DESCRIPTION OF THE DRAWINGS

Specific embodiments of the invention will now be described with reference to the accompanying drawings, in which.

DETAILED DESCRIPTION

To illustrate the present invention, various practical examples using techniques in accordance with the invention are described below:

EXAMPLE 1

Figure 3:
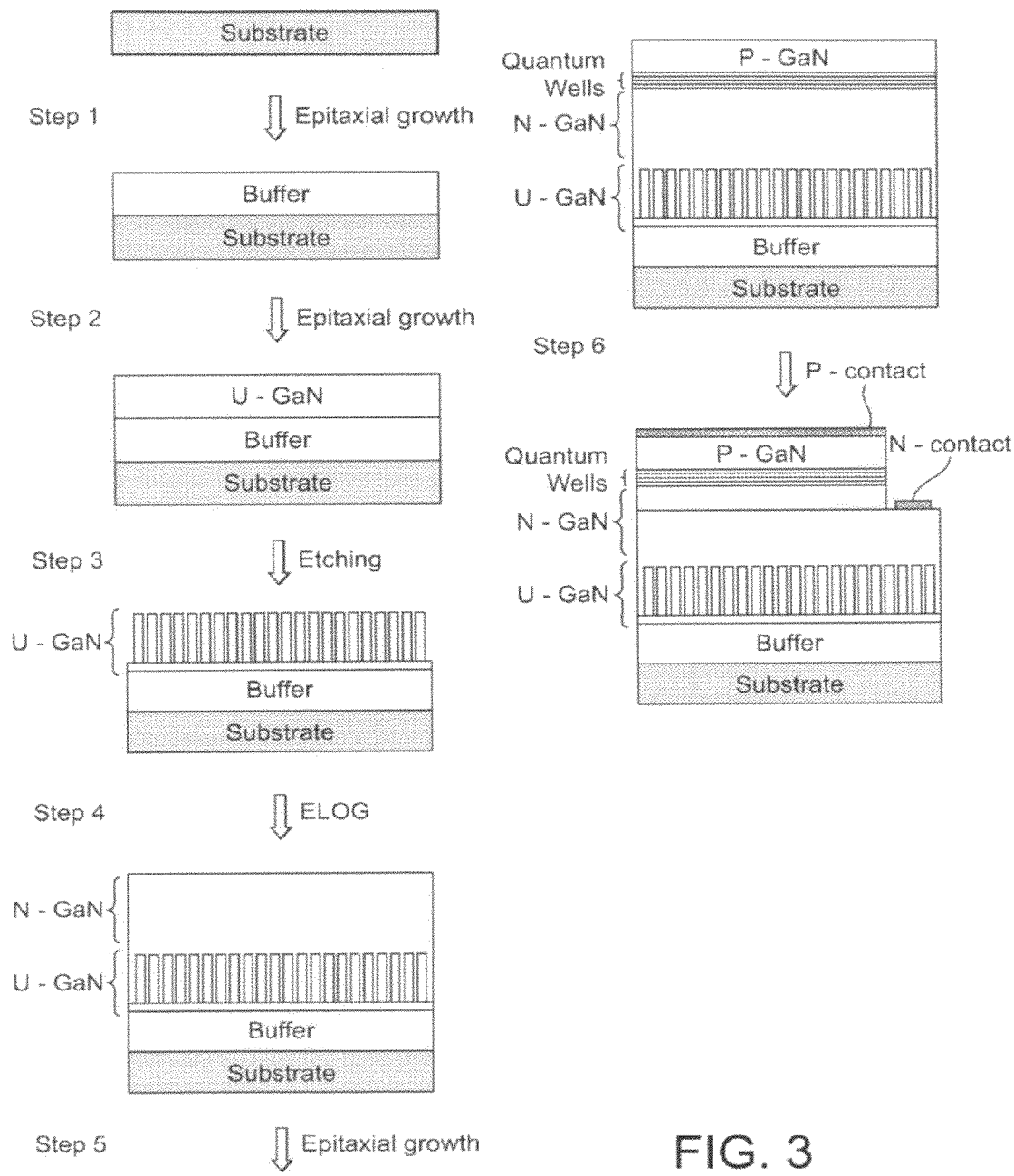
FIG. 3 schematically shows the process flow for the growth and fabrication of full light emitting diode devices with insulating substrates.

Example 1 relates to the growth and fabrication of full light emitting diode (LED) devices with insulating substrates. FIG. 3 schematically shows the process flow for such a method. Each device is attached to the nano-column substrate. The nano-column substrate enhances the light extraction from the top. The low strain and low defect lateral-grown layer improves the internal quantum efficiency of the devices.

In this Example, a c-plane-oriented sapphire substrate of about 2 inches (5.08 cm) in diameter is used, on which a buffer of GaN grown at around 350-550° C. of about 20 nm thickness, followed by undoped GaN of about 1 μm thickness is epitaxially grown as shown in Step 1 of FIG. 3. Un-doped U—GaN of about 2-3 μm is deposited by MOCVD (Step 2 of FIG. 1) to form the template for the fabrication of nano-columns. Before loading, the GaN template is degreased in KOH for few seconds, rinsed in de-ionized water, etched in a $H_2SO_4/H_3PO_4$=3:1 solution at about 80° C. for few minutes, then rinsed in de-ionized water. A thin dielectric layer of $SiO_2$ or $Si_3N_4$ of ~200 nm is deposited by PECVD onto the GaN template. Then a thin Ni metal of about 2-6 nm is deposited by e-beam evaporation or sputtering onto the dielectric layer. Rapid annealing of the metal under $N_2$ gas ambient at ~830° C. for about one minute is carried out to form high density Ni nano-dots. Selecting the thickness of the Ni metal enables the density and dimensions of the Ni nano-dots to be controlled. Reactive ion etching (RIE) using Ar and $CHF_3$ is used to etch the dielectric materials using the Ni nano-dots. ICP etching using a gas mixture of Ar, $H_2$, $Cl_2$, or $BCl_3$ is then carried out to etch the GaN material layer using metal and dielectric nano-masks to &inn a high density of nano-columns (Step 3 of FIG. 3).

Residual Ni nano-dots are removed using $HNO_3$ solution. Residual dielectric materials of $SiO_2$ or $Si_3N_4$ are removed by buffered oxide etch solution and phosphoric acid respectively. Further wet etching using KOH enables fine tuning of the dimension of the nano-columns.

Ex-situ nitridation process is carried out using PECVD with silane and $NH_3$ gas. The tip of the nitridated nano-columns is slightly etched off by RIE.

An initial epitaxial lateral overgrowth (ELOG) is carried out by a MOCVD growth process, shown by Step 4 of FIG. 3: firstly, the nitridated GaN nano-column template is loaded into the MOCVD reactor. The substrate temperature is then raised to about 1020° C. with an $NH_3$ flow of about 2000 sccm and trimethylgallium (TMG) flow to about 5 sccm. After approximately 30 minutes growth, the trimethylgallium (TMG) flow is set to about 10 sccm for 10 minutes' growth, followed by about 20 sccm for about 20 minutes' growth. The continuous GaN is fully coalesced within the first 30 minutes.

The main advantage using the nitridation on nano-columns is to prevent quick coalescence in the root of the nano-columns, which may destroy the de-coupling mechanism of using nano-columns. A nitridated surface has an anti-surfactant effect which inhibits the lateral growth of GaN.

Figure 1:
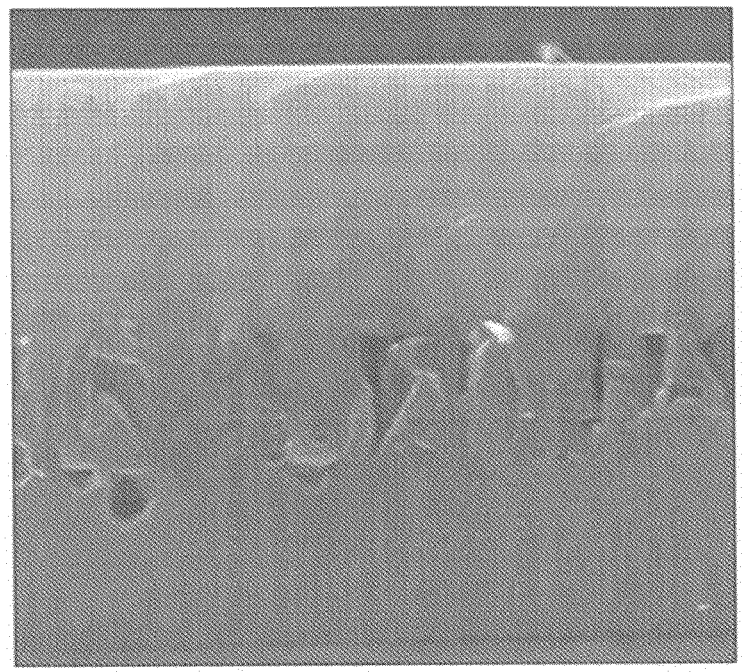
FIG. 1 shows an SEM cross-sectional view of high quality bulk growth GaN on GaN nano-columns.
Figure 2:
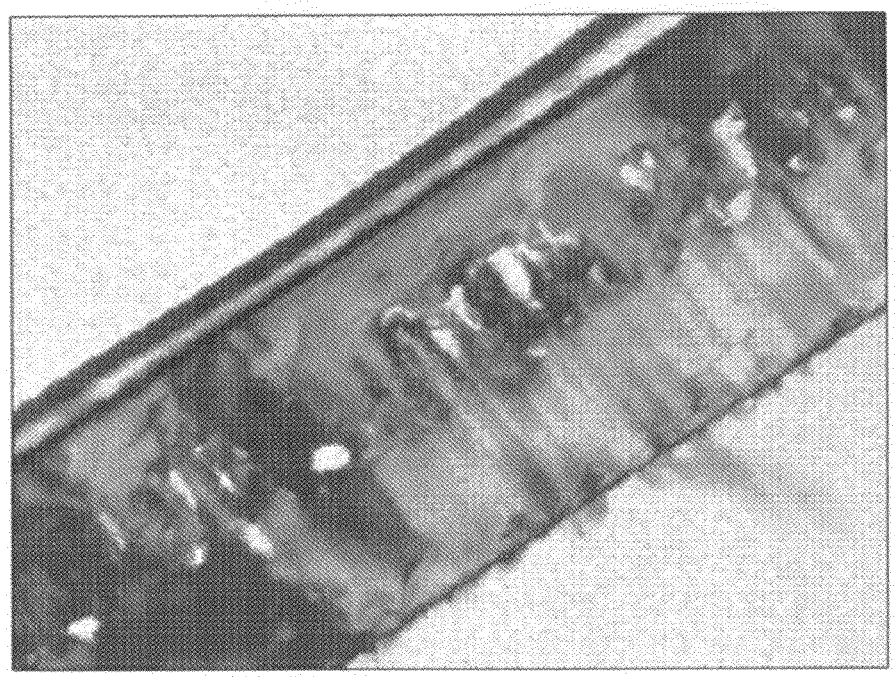
FIG. 2 shows a high resolution cross-sectional TEM view of high quality bulk GaN on GaN nano-columns.

FIG. 1 shows an SEM cross-sectional view of the ELOG-grown GaN on GaN nano-columns. FIG. 2 shows a high resolution cross-sectional TEM image of the high quality bulk GaN on GaN nano-columns. The image clearly shows that very few threading dislocations are observed on the top ELOG-grown GaN. There are some stacking faults parallel to the growth surface of the ELOG GaN near the GaN nano-columns, but the nano-pendeo growth bends all defects strongly at the interface of the ELOG GaN and the nano-columns. Therefore the ELOG GaN contains very few defects.

The epitaxial growth of the full device is then continued in the MOCVD reactor, as shown in Step 5 of FIG. 3. A typical LED structure produced comprises the following layers: an n-type Si-doped GaN layer (about 1.5-2 µm), an InGaN/GaN MQW active region (about 35 Å/100 Å, 2-6 pairs) and an AlGaN:Mg capping layer (about 200 Å) which together are shown as the "quantum wells" layer in FIG. 3, and p-type Mg-doped GaN (about 0.2-0.3 µm). The electron and hole concentration in the GaN:Si and GaN:Mg layers are about $3 \times 10^{18}$ cm$^{-3}$ and $6 \times 10^{17}$ cm$^{-3}$ respectively.

An n-contact is fabricated first by ICP etching with an $SiO_2$ mask using a gas mixture of Ar, $H_2$, $Cl_2$, or $BCl_3$, and then Ti/Al (20/100 nm) is deposited. A p-contact is fabricated by depositing Ni/Au (about 5/5 nm) using e-beam evaporation, followed by annealing for about 5 minutes at around 550° C. in an oxygen atmosphere.

EXAMPLE 2

Similarly to Example 1, the initial epitaxial lateral overgrowth is carried out by a MOCVD growth process. However, in this Example, trimethylaluminum (TMA) partially or totally replaces the trimethylgallium (TMG) used in Example 1 to grow an AlGaN layer.

Epitaxial growth of the full device, in this case an LED, is continued in the MOCVD reactor. The LED structure grown comprises the following layers: an n-type Si-doped AlGaN layer (about 1.5-2 µm), an AlxGa1–xN/AlyGa1–yN MQW active region (about 35 Å/100 Å, 2-6 pairs, and y≧x+0.03), an AlGaN:Mg capping layer (~200 Å), and p-type Mg-doped AlGaN (about 0.2-0.3 µm). The electron and hole concentration in the AlGaN:Si and AlGaN:Mg layers are about $10^{18}$ cm$^{-3}$ and $6 \times 10^{17}$ cm$^{-3}$ respectively. The LEDs produced are suitable for producing light of UV region wavelength.

EXAMPLE 3

In this Example, the template used is a-plane GaN or AlGaN grown on top of a γ-plane sapphire substrate. Otherwise the production of nano-columns is as described for Examples 1 or 2. This template has particular advantage that it may be used to grow a non-polar semiconductor layer, which may be especially beneficial for the fabrication of optical components such as white LEDs (see below).

Epitaxial growth of the full device, in this case an LED, is continued in the MOCVD reactor. The LED structure produced comprises the following layers: an n-type Si-doped GaN layer (about 1.5-2 µm), an InGaN/GaN MQW active region (6 pairs QWs, with the quantum well width of 25, 35, 45, 55, 75, 90 Å and barrier of 100 Å), an AlGaN:Mg capping layer (~200 Å), and p-type Mg-doped GaN (about 0.2-0.3 µm). The electron and hole concentration in the GaN:Si and GaN:Mg layers are about $3 \times 10^{18}$ cm$^{-3}$ and $6 \times 10^{17}$ cm$^{-3}$, respectively. This device will give a much broader bandwidth than conventional LEDs, to produce for example white LEDs.

EXAMPLE 4

In this Example, the template used comprises m-plane GaN (p-type, n-type doped or un-doped) grown on top of m-plane 4H- and 6H—SiC. The nano-columns may be grown in accordance with the methods of Examples 1 and 2. As in Example 3, this choice of template enables the production of a non-polar semiconductor layer, which may be beneficial for certain optical components.

The epitaxial growth of the full device, in this case an LED, is continued in the MOCVD reactor. The LED structure grown comprises the following layers: an n-type Si-doped GaN layer (about 1.5-2 µm), an InGaN/GaN MQW active region (6 pairs QWs, with quantum well widths of 25, 35, 45, 55, 75 and 90 Å and barrier of 100 Å), an AlGaN:Mg capping layer (~200 Å), and p-type Mg-doped GaN (0.2-0.3 µm). The electron and hole concentration in the GaN:Si and GaN:Mg layers are about $3 \times 10^{18}$ cm$^{-3}$ and $6 \times 10^{17}$ cm$^{-3}$ respectively. Due to the non-polar nature of the semiconductor layer, this device gives a much broader bandwidth than conventional LEDs.

EXAMPLE 5

Figure 4:
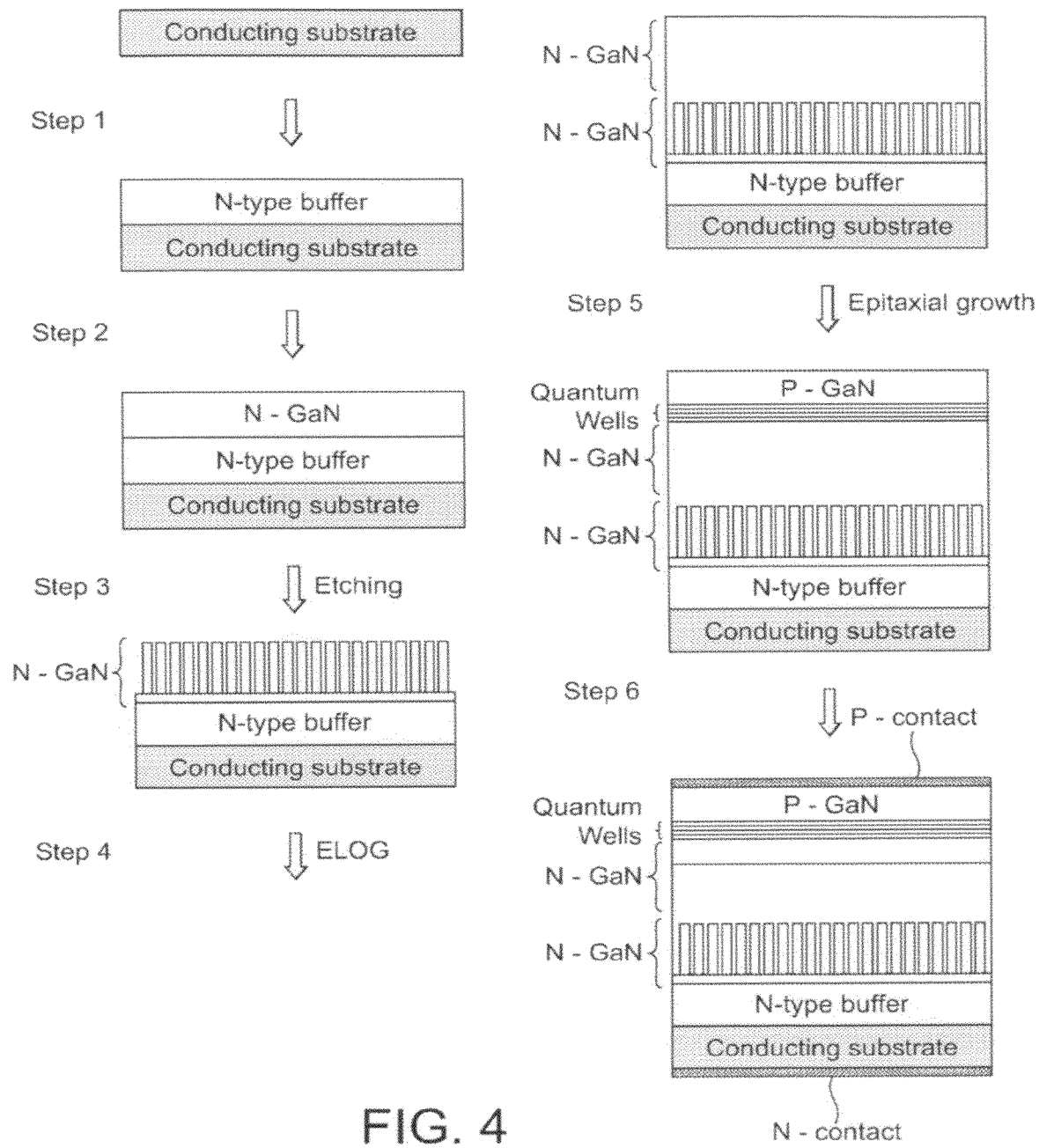
FIG. 4 schematically shows the process flow for the growth and fabrication of full light emitting diode devices with conducting substrates.

In contrast to the previous examples which used an insulating substrate, here the template used comprises n-GaN grown on top of a conducting substrate such as free-standing n-GaN, n-Si, n-type 4H- or 6H—SiC. FIG. 4 schematically shows the process flow for the growth and fabrication of full LED devices with conducting substrates. In Step 1, an n-type buffer is grown onto the conducting substrate. This is followed in Step 2 by a layer of n-GaN. Nano-columns are formed by etching in Step 3, using a similar process as described in Example 1. An initial epitaxial lateral overgrowth produces a layer of n-GaN in Step 4. In Step 5, the LED layers are grown as in previous Examples. In Step 6, a p-type contact of Ni/Au alloy at about 10/10 nm deposited by e-beam evaporation and annealed at about 550° C. for around 5 minutes under oxygen is formed on top of the p-GaN as in previous Examples. In this case, the n-type contact is grown on the opposite face of the substrate. In the present Example, where free-standing n-GaN is used as the substrate, Ti/Al of about 20/100 nm thickness are used as the n-contact metals.

EXAMPLE 6

Figure 5:
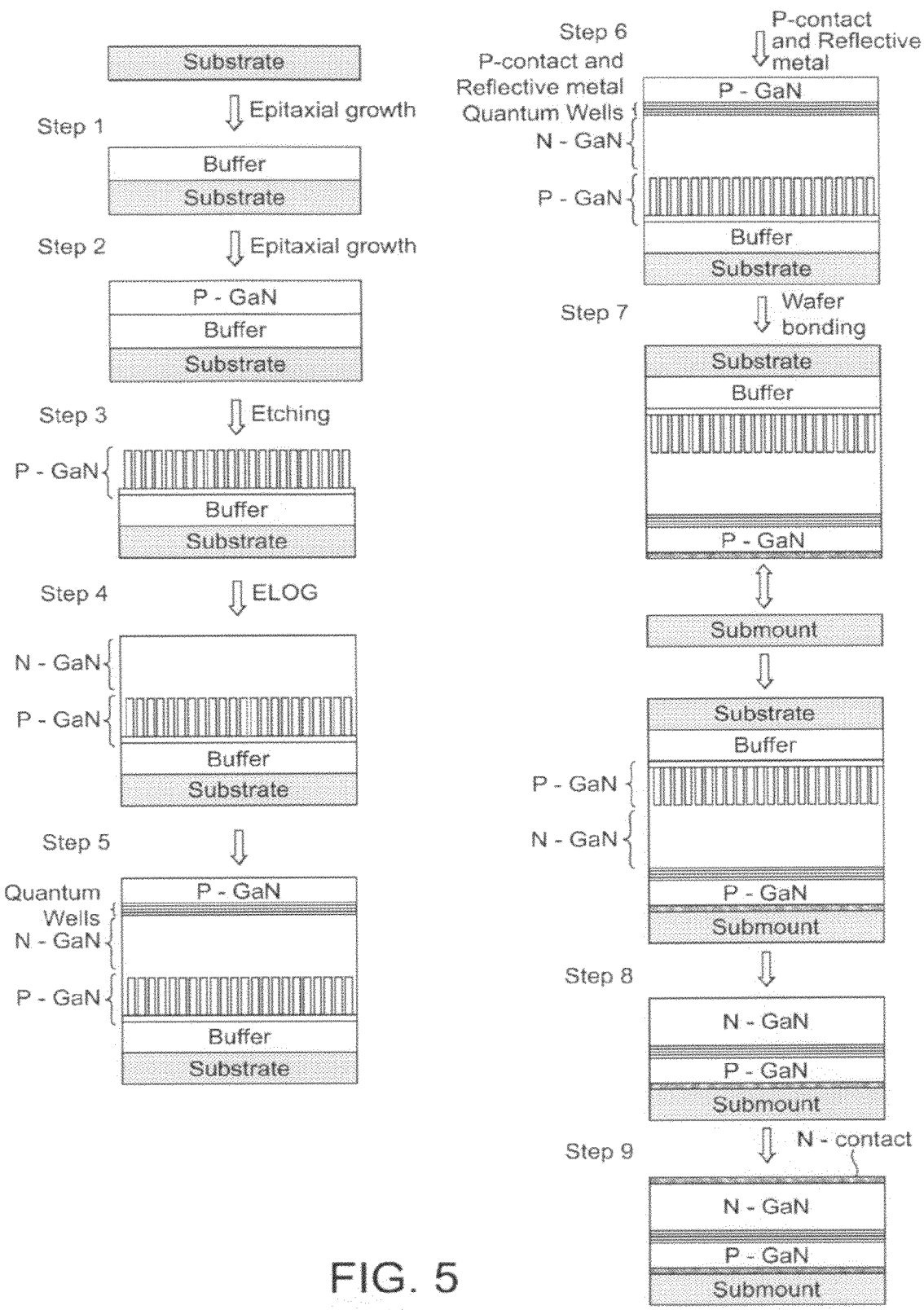
FIG. 5 schematically shows the process flow for the growth and fabrication of thin GaN light emitting diode devices with the substrate separated.

In Examples 1 to 5, the devices produced are mounted onto the substrate and nano-column structure. In Example 6 however, the devices are separated from the substrate and mounted on a custom-made submount, resulting in a relatively thin final component. FIG. 5 schematically shows the process flow for the growth and fabrication of a thin GaN LED device with the substrate, in this case sapphire, separated. Steps 1 and 2 are similar to previously-described examples, except that here p-type GaN is grown onto the substrate to form the template. The p-GaN top layer is then etched (Step 3) to form p-GaN nano-columns. This will facilitate the separation process (described below) due to the relatively high wet etching rate (for example using KOH, electrochemical etching or photochemical etching) of p-GaN. In Step 4, thick n-GaN is laterally overgrown onto the p-GaN nano-columns. In Step 5, the device is grown onto the n-GaN in a similar manner as for previous Examples. In Step 6, a p-type contact of Ni/Au alloy of about 10/10 nm thickness is formed on top of the p-GaN as in previous Examples, i.e. deposited by e-beam evaporation and annealed at around 550° C. for about 5 minutes under oxygen. A further Ti/Al/Au/Sn—Au reflective metal and bonding alloy at about 10/200/100/300 nm thickness is deposited on top of the p-contact Ni/Au alloy. In Step 7, the bonding alloy of Sn—Au on top of the p-GaN is heated beyond its melting point around 285° C. so that the p-GaN can be bonded to a submount of better thermal conductivity. The submount may consist of SiC, MN, CVD diamond, Si, metal, and alloys for example. Au plating on top of the submount may be used to assist the bonding of p-GaN, and the electrical connection can then be through the bonding pad on the submount. In Step 8, the substrate is separated from the device, here using an electrochemical method, in which the thick N—GaN acts as the anode, a Pt mesh is used as the cathode and either KOH or $H_3PO_4$ is used as the electrolyte. A bias voltage (to Pt reference electrode) of about 3.5 to 4 V is applied to selectively etch away the p-GaN. The full device is typically separated from the substrate after 20 minutes etching. In Step 9, an n-type contact of Ti/Al of 20/50 nm is deposited and fabricated on top of the thick N—GaN. It can be seen that this technique enables the production of relatively thin devices.

EXAMPLE 7

In this Example, a template comprising n-GaN grown on top of a conducting substrate such as free-standing n-GaN, n-Si, n-type 4H- and 6H—SiC is used, similar to Example 5 above. Using this template, a full laser diode structure may be grown by MOCVD. This may comprise a layer structure such as that listed in Table 1 below, in which the uppermost layer is listed first.

TABLE 1

Epitaxial Structures

| Layer | Thickness (nm) | Note |
|---|---|---|
| p+ InGaN | ~2 | p+ InGaN capping layer |
| P+-GaN | ~12 | |
| p-GaN | ~12 | |
| p-cladding | ~610 | MD-p-SLS, periodicity = 5.11 nm, [Al] = ~10.5% |
| p-waveguide | ~110 | |
| p-blocking layer | ~20 | [Al] = ~20% |
| 2 Quantum Wells | ~20 | 14 nm Si:InGaN/3.2 u-InGaN nm, λp = ~410 and 450 nm 4% and 12% In |
| n-waveguide | ~110 | n-GaN (~ 60 nm) + n-InGaN (~50 nm) |
| Si:AlGaN cladding layer | ~620 | 9% AlGaN |
| Si:AlGaN cladding layer | ~900 | 3% AlGaN |
| Si:InGaN compliance layer | ~100 | |
| MOCVD grown Si:GaN | ~1000 | |
| GaN nano-columns | ~1500 | |
| Conducting substrate | ~400 | um e.g. free-standing n-GaN |

EXAMPLE 8

This Example illustrates an alternative method for producing the required nano-column structure, using an anodic porous alumina nano-mask fabrication process. A c-plane-oriented sapphire substrate of about 2 inches (5.08 cm) in diameter, with MOCVD-deposited GaN of about 2-3 μm is loaded onto the substrate holder of an HVPE vertical reactor. Before loading, the GaN template is degreased in KOH for few seconds, rinsed in de-ionized water, etched in a $H_2SO_4$/$H_3PO_4$=3:1 solution at about 80'C for a few minutes, then rinsed in de-ionized water. A thin dielectric layer of $SiO_2$ or $Si_3N_4$ of ~200 nm is deposited by PECVD onto the GaN template. Then a thin Al metal of 60-200 nm is deposited by e-beam evaporation or sputtering onto the dielectric layer. A two step anodization process is adapted: the first anodization is conducted under 0.3 M oxalic acid solution at about 5° C. with current ~100 mA and 20 V for around 6 hours to form a layer of oxide (alumina) on top of the aluminum layer. The surface texture of the aluminum is changed by the anodization process, producing concavities. The oxide is then removed by a mixture of 6 wt % $H_3PO_4$ and 1.8 wt % $H_2CrO_4$ at about 60° C. for 1-1.5 hours. The second anodization is conducted under the same oxalic solution at ~100 mA and 40 V for around 5 hours. The second anodization is required to create a more uniform nano-mask pattern. Trace aluminum may then be removed from the alumina layer. 5 wt % $H_3PO_4$ is used to smooth and enlarge the pores of the anodic porous alumina. Then a thin Ni metal layer of 4-10 nm is deposited by e-beam evaporation or sputtering onto the pores of the anodic porous alumina, producing Ni nano-dots. 5 wt % $H_3PO_4$ is then used to remove all alumina. Reactive ion etching (RIE) using Ar and $CHF_3$ is used to etch the dielectric materials using the Ni nano-dots. Then ICP etching using a gas mixture of Ar, $H_2$, $Cl_2$, or $BCl_3$ is carried out to etch GaN materials using the metal and dielectric nano-masks to form a high density of nano-columns.

Residual Ni nano-dots are removed using $HNO_3$ solution. Residual dielectric materials of $SiO_2$ or $Si_3N_4$ are removed by buffered oxide etch solution and phosphoric acid respectively. Further wet etching using KOH allows fine tuning of the dimensions of the nano-columns.

The nano-columns thus produced may be used in the fabrication of devices as for the previous Examples.

EXAMPLE 9

Here, the initial MOCVD epitaxial lateral overgrowth process described in Example 1 is replaced by a pulsed HVPE growth method. In this method, the flow sequence of reagent gases is on ($NH_3$ and GaCl on) and off (GaCl on and $NH_3$ off) in turn for the lateral growth mode. The times for the on and off periods are set to be around 60 seconds and 15 seconds respectively. The GaN growth step is continued until a continuous GaN epitaxial layer is produced. If the V/III ratio is set between 10 and 40 in the vertical reactor, a growth rate of around 30-120 µm/hour can be achieved.

It will be apparent to those skilled in the art that a wide range of methods and process parameters can be accommodated within the scope of the invention, not just those explicitly described above. For example, nano-columns may be fabricated in a variety of ways, which will be apparent to those skilled in the art. The nano-columns may be fabricated so as to have various shapes of tips, chosen as appropriate for the application in hand. The nano-columns may be fabricated in a controlled manner so as to have various predetermined patterns of nano-columns for the application in hand. The patterns can for example be photonic crystal, photonic quasicrystal, or gratings. Such patterns may be achieved by using a nano-imprint mask fabrication process for example. This enables the production of unique devices (e.g. LEDs). The material of the nano-columns does not have to be constant, for example the alloy content may be varied along its height in the initial layer structure of the template so that its properties are most suitable for the specific application. For example, the alloy content may be selected so as to optimize absorption during a laser ablation separation process. Alternatively, a change in the alloy content may optimize the lattice constant for the overgrown semiconductor. Furthermore, the nano-column material need not be identical to that of the overgrown compound semiconductor.

In the specific examples described, nano-columns are fabricated from the semiconductor template before overgrowth of the semiconductor material. However, use of a nano-columns layer may permit relatively easy removal of the semiconductor, without causing undue damage to the underlying substrates. The semiconductor material can then be prepared to grow the full epitaxial devices.

The invention claimed is:

1. A method of producing a layered semiconductor device comprising the steps of:
   a) providing a base comprising a plurality of semiconductor nano-structures,
   b) growing a semiconductor material onto the nano-structures using an epitaxial growth process, and
   c) growing a layer of the semiconductor device onto the semiconductor material using an epitaxial growth process;
   wherein the plurality of semiconductor nano-structures is located on a substrate and the method comprises the initial step of producing the nano-structures by etching a semiconductor template on the substrate until the substrate is exposed.

2. A method according to claim 1, wherein the nano-structures comprise a material selected from the group consisting of GaN, AlN, InN, ZnO, SiC, Si, and alloys thereof.

3. A method according to claim 1, wherein the template comprises a simple layer, or multiple layers, or a heterostructure, or superlattices consisting of n-or p-type doped or un-doped semiconductors comprising III-V or II-VI compounds.

4. A method according to claim 1, wherein the template comprises a simple layer, or multiple layers, or a heterostructure, or superlattices consisting of n-or p-type doped or un-doped semiconductors selected from AlN, AlxGa1-xN with 1>x>0, GaN and InxGa1-xN with 1>x>0.

5. A method according to claim 1, wherein the template comprises a p-GaN top layer.

6. A method according to claim 1, wherein each nano-structure comprises a nano-column.

7. A method according to claim 1, wherein the substrate material is selected from a group consisting of sapphire, silicon, silicon carbide, diamond, metals, metal oxides, compound semiconductors, glass, quartz and composite materials.

8. A method according to claim 1, wherein the substrate material comprises a single crystal with a specific crystal orientation.

9. A method according to claim 1, wherein step (c) includes growing at least one additional layer.

10. A method according to claim 1, further comprising the step of creating a contact electrode on the device.

11. A method according to claim 1, further comprising the step of, if the substrate is formed of a conducting material, creating a contact electrode on the substrate.

12. A method according to claim 1, comprising the step of separating the base from the semiconductor material grown in step (b).

13. A method according to claim 12, wherein after separation, a contact electrode is created on the semiconductor material.

14. A method according to claim 1, comprising the step of bonding the device to a submount.

15. A method according to claim 1, wherein the device is an optical device.

16. A method according to claim 1, wherein, in step (c), the device is fabricated from non-polar epitaxial semiconductor material.

17. A method according to claim 1, wherein the semiconductor material grown in step (b) is non-polar.

18. A method according to claim 17, wherein the substrate comprises γ-plane sapphire or m-plane 4H- or 6H- SiC.

* * * * *

UNITED STATES PATENT AND TRADEMARK OFFICE
CERTIFICATE OF CORRECTION

PATENT NO.       : 8,383,493 B2  
APPLICATION NO.  : 12/376435  
DATED            : February 26, 2013  
INVENTOR(S)      : Wang Nang Wang Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 151 days.

Signed and Sealed this

First Day of September, 2015

Michelle K. Lee
*Director of the United States Patent and Trademark Office*